(12) United States Patent
Lee et al.

(10) Patent No.: US 8,779,411 B2
(45) Date of Patent: Jul. 15, 2014

(54) LIGHT EMITTING DIODE HAVING METAL NANOPARTICLE LAYERED GRAPHENE

(71) Applicant: Gwangju Institute of Science and Technology, Gwangju (KR)

(72) Inventors: Dong Seon Lee, Gwangju (KR); Jae Phil Shim, Gwangju (KR); Seong Ju Park, Gwangju (KR); Min Hyeok Choe, Gwangju (KR); Do Hyung Kim, Gwangju (KR); Tak Hee Lee, Seoul (KR)

(73) Assignee: Gwanju Institute of Science and Technology, Buk-gu, Gwanju (KR)

( * ) Notice: Subject to any disclaimer, the term of this patent is extended or adjusted under 35 U.S.C. 154(b) by 0 days.

(21) Appl. No.: 13/679,353

(22) Filed: Nov. 16, 2012

(65) Prior Publication Data
US 2013/0285012 A1 Oct. 31, 2013

(30) Foreign Application Priority Data

Apr. 26, 2012 (KR) .......................... 10-2012-0044091

(51) Int. Cl.
*H01L 29/06* (2006.01)
*H01L 31/00* (2006.01)
*H01L 33/00* (2010.01)

(52) U.S. Cl.
USPC ........ 257/13; 257/95; 257/103; 257/E33.074; 977/720; 977/773; 977/774; 977/825; 977/932

(58) Field of Classification Search
USPC .............. 257/95, 103, E33.074, 13; 977/720, 977/773, 774, 825, 932
See application file for complete search history.

(56) References Cited

U.S. PATENT DOCUMENTS

| | | | | |
|---|---|---|---|---|
| 8,076,667 B2 * | 12/2011 | Tansu et al. | ...................... | 257/13 |
| 8,217,571 B2 * | 7/2012 | Lee et al. | ...................... | 313/504 |
| 8,357,922 B2 * | 1/2013 | Hong et al. | ...................... | 257/9 |
| 8,492,747 B2 * | 7/2013 | Choi et al. | ...................... | 257/29 |
| 8,536,614 B2 * | 9/2013 | Hsu et al. | ...................... | 257/99 |

(Continued)

OTHER PUBLICATIONS

Published on 1st Conference on Korea Society of Optoelectronics, Nov. 17, 2011, Shim, J.P., et al., "Application of Ag nano particle on graphene as current spreading layer in InGaN/GaN based blue light emitting diodes", 3 pages.

*Primary Examiner* — Ida M Soward
(74) *Attorney, Agent, or Firm* — Nath, Goldberg & Meyer; Joshua B. Goldberg (57) ABSTRACT

The present disclosure provides a light emitting diode and a method of manufacturing the same. The light emitting diode includes a graphene layer on a second conductive semiconductor layer and a plurality of metal nanoparticles formed on some region of the graphene layer, whereby adhesion between the second conductive semiconductor layer comprised of an inorganic material and the graphene layer is enhanced, thereby securing stability and reliability of the light emitting diode. In addition, the light emitting diode allows uniform spreading of electric current, thereby allowing stable emission of light through a surface area of the light emitting diode. The method of manufacturing a light emitting diode includes forming a graphene layer on a second conductive semiconductor layer, forming a mask film on the graphene layer, forming a metal layer within the patterns of the mask film, followed by removing the mask film; and heat treating the metal layer to form a plurality of metal nanoparticles, whereby the metal nanoparticles having a high index of refraction are formed on some region of the graphene layer and provide surface texturing effects, thereby improving light emission efficiency.

6 Claims, 10 Drawing Sheets

(56) References Cited

U.S. PATENT DOCUMENTS

| | | | |
|---|---|---|---|
| 8,564,009 B2 * | 10/2013 | Min et al. | 257/99 |
| 8,569,736 B2 * | 10/2013 | Wei et al. | 257/13 |
| 8,641,915 B2 * | 2/2014 | Kim et al. | 216/37 |
| 2005/0127334 A1 * | 6/2005 | Shibata et al. | 252/502 |
| 2011/0041980 A1 * | 2/2011 | Kim et al. | 156/60 |
| 2011/0186799 A1 * | 8/2011 | Kai et al. | 257/3 |
| 2011/0217455 A1 * | 9/2011 | Veerasamy | 427/122 |
| 2012/0141799 A1 * | 6/2012 | Kub et al. | 428/408 |
| 2012/0325305 A1 * | 12/2012 | Chandra et al. | 136/256 |
| 2013/0082290 A1 * | 4/2013 | Yan et al. | 257/98 |
| 2013/0263918 A1 * | 10/2013 | Konstantatos et al. | 136/252 |

* cited by examiner

Fig. 6c

LIGHT EMITTING DIODE HAVING METAL NANOPARTICLE LAYERED GRAPHENE

CROSS-REFERENCE TO RELATED APPLICATION

This application claims priority to Korean Patent Application No. 10-2012-0044091 filed on 26 Apr. 2012 and all the benefits accruing therefrom under 35 U.S.C. §119, the contents of which are incorporated by reference in their entirety.

BACKGROUND

1. Technical Field

The present invention relates to a light emitting diode and a method of manufacturing the same, and more particularly, to an inorganic material-based light emitting diode, which uses graphene as a current spreading layer, and a method of manufacturing the same.

2. Description of the Related Art

Currently, an indium tin oxide (ITO) film obtained by doping tin oxide into indium oxide is most commonly used as a current spreading layer of a light emitting diode. However, the ITO film has problems such as transmittance variation according to wavelength, limited flexibility, depletion of indium as a raw material thereof, and the like. Thus, various studies have been actively conducted to replace the indium tin oxide film by a graphene film.

With various advantages, such as a high optical transmittance of 90% or more in the overall wavelength range, excellent electrical conductivity, excellent flexibility, and the like, graphene has attracted attention as a material capable of replacing indium tin oxide. Generally, a graphene film is prepared by chemical vapor deposition (CVD) and then transferred to a desired substrate.

Recently, a nitride-based light emitting diode including a current spreading layer composed of a graphene film prepared through CVD is disclosed [Large-scale patterned multi-layer graphene films as transparent conductive electrodes for GaN light-emitting diodes, G. Jo et al., Nanotechnology, 2010].

However, since graphene consists of carbon atoms bonded to each other, it exhibits low adhesion to an inorganic material layer when applied to an inorganic material-based light emitting diode, so that some of the graphene film is lost in a transfer process and causes deterioration in luminescent characteristics.

In addition, since the graphene film has a very low thickness, some parts of the graphene film overlap, creating wrinkles during the transfer process, thereby causing non-uniform spreading of electric current. In particular, a power light emitting diode requiring high optical output often suffers from electrode loss due to concentration of high electric current near an electrode.

Korean Patent Publication No. 10-2009-0049065A discloses a technology for improving light emission efficiency by improvement of light extraction through surface texturing of an n-type semiconductor layer formed on top of a light emitting diode. In this document, light extraction efficiency can be improved by about 20% or more. However, even a graphene film comprised of multiple layers has a small thickness of about 2 nm to 3 nm. Thus, when the graphene film is formed on a surface subjected to texturing, the film is damaged due to surface roughness, thereby making it difficult to achieve further improvement of light emission efficiency through surface texturing.

BRIEF SUMMARY

Therefore, the present invention is aimed at providing a light emitting diode, which includes a graphene film having metal nanoparticles formed on some regions thereof to secure reliability while improving light emission efficiency, and a method of manufacturing the same.

One aspect of the present invention provides a light emitting diode. The light emitting diode includes: a compound semiconductor layer including a first conductive semiconductor layer, an active layer and a second conductive semiconductor layer; a graphene layer formed on the second conductive semiconductor layer; a plurality of metal nanoparticles formed on the graphene layer; a first electrode formed on the first conductive semiconductor layer; and a second electrode formed on the graphene layer. Here, the metal nanoparticles are formed on some region of the graphene layer.

The metal nanoparticles formed on the graphene layer may occupy from 20% to 40% of a surface area of the graphene layer, and some region of the graphene layer may be formed with hole patterns periodically arranged at a constant pitch.

The metal nanoparticles may include one selected from Au, Ag, Pt, Lu, Rh, Pd, Ir, and Os, and may have a particle diameter of 50 nm to 300 nm.

The compound semiconductor layer may be nitride-based compound semiconductor layer.

Another aspect of the present invention provides a method of manufacturing a light emitting diode. The method may include: forming a compound semiconductor layer including a first conductive semiconductor layer, an active layer and a second conductive semiconductor layer; forming a graphene layer on the second conductive semiconductor layer; forming a mask film having a pattern on the graphene layer; forming a metal layer in the pattern of the mask film, followed by removing the mask film; heat treating the metal layer to form a plurality of metal nanoparticles; and forming a first electrode on the first conductive semiconductor layer and a second electrode on the graphene layer.

The heat treatment may be performed at a temperature from 500° C. to 700° C.

The forming a graphene layer on the second conductive semiconductor layer may include transferring the graphene layer onto the second conductive semiconductor layer, and the graphene layer may be formed through chemical vapor deposition.

According to the present invention, in the light emitting diode and the method of manufacturing the same, metal nanoparticles are formed on some region of a graphene layer, whereby adhesion between the second conductive semiconductor layer composed of inorganic materials and the graphene layer can be enhanced, thereby securing stability and reliability of the light emitting diode. In addition, the light emitting diode according to the present invention allows uniform spreading of electric current, thereby allowing stable emission of light through a surface area of the light emitting diode.

Further, metal nanoparticles having a high degree of refraction are formed on some regions of the graphene layer and cause surface scattering of light, thereby improving light emission efficiency.

The present invention is not limited to the aforementioned effects and other effects will become apparent to those skilled in the art from the following description.

BRIEF DESCRIPTION OF THE DRAWINGS

The above and other aspects, features, and advantages of the invention will become apparent from the detailed description of the following embodiments in conjunction with the accompanying drawings, in which.

DETAILED DESCRIPTION

Exemplary embodiments of the present invention will now be described in detail with reference to the accompanying drawings. However, it should be understood that the present invention is not limited to the following embodiments and may be embodied in different ways by those skilled in the art without departing from the scope of the present invention. Further, it should be understood that various modifications and equivalent embodiments may be made by those skilled in the art without departing from the spirit and scope of the present invention.

It will be understood that when a layer is referred to as being "on" another layer or substrate, it can be directly formed on the other layer or substrate, or an intervening layer(s) may also be present. In addition, spatially relative terms, such as "above," "upper (portion)," "upper surface," and the like may be understood as meaning "below," "lower (portion)," "lower surface," and the like according to a reference orientation. In other words, the expressions of spatial orientations are to be construed as indicating relative orientations instead of absolute orientations.

In the drawings, the thicknesses of layers and regions can be exaggerated or omitted for clarity. The same components will be denoted by the same reference numerals throughout the specification.

FIGS. 1a to 1f are sectional views of a method of manufacturing a light emitting diode in accordance with one exemplary embodiment of the present invention.

Figure 1A:
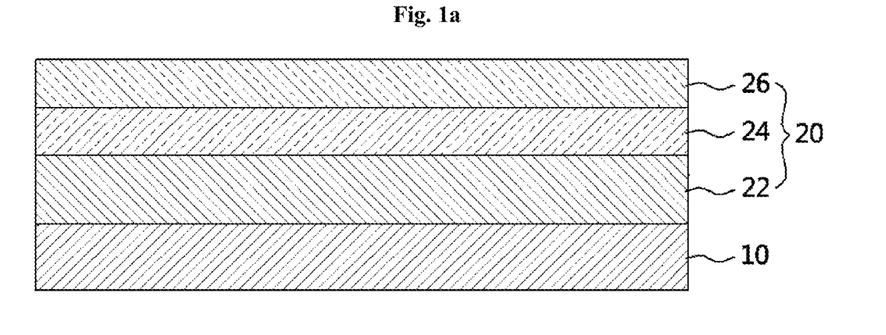
FIG. 1a to FIG. 1f are sectional views of a method of manufacturing a light emitting diode in accordance with one exemplary embodiment of the present invention.

Referring to FIG. 1a, a compound semiconductor layer 20 including a first conductive semiconductor layer 22, an active layer 24 and a second conductive semiconductor layer 26 are formed on a substrate 10.

The substrate 10 may be a homogeneous or heterogeneous substrate with the compound semiconductor layer 20. For example, when the compound semiconductor layer 20 are composed of GaN-based compound semiconductor layer, a GaN-based substrate may be used as a homogenous substrate. Alternatively, a sapphire substrate, Si substrate, SiC substrate or spinel substrate may be used as a heterogeneous substrate. However, the present invention is not limited thereto, and any substrate enabling growth of the compound semiconductor layer 20 thereon may be used without limitation.

In some embodiments, the compound semiconductor layer 20 may be GaN-based compound semiconductor layer. The GaN-based compound semiconductor is a direct transition type semiconductor, which enables control of wavelengths from a visible light band to a UV band, and has excellent properties such as high thermal/chemical stability, high electron mobility, high energy band-gap, and the like.

In some embodiments, a buffer layer (not shown) may be further formed between the substrate 10 and the compound semiconductor layer 20. The buffer layer serves to mitigate difference in lattice constant and coefficient of thermal expansion between the substrate and the first conductive semiconductor layer, thereby enhancing crystallinity. The buffer layer may be an undoped GaN layer or MN layer.

The first conductive semiconductor layer 22 may be, for example, an n-type GaN layer which supplies electrons. The active layer 24 formed on the first conductive semiconductor layer 22 generates photons through recombination of electrons and holes, and may have a multi-quantum well structure wherein at least one well layer and at least one barrier layer are alternately stacked one above another. For example, the active layer 24 may be comprised of InGaN layers and GaN layers alternately stacked one above another. The second conductive semiconductor layer 26 formed on the active layer 24 may be, for example, a p-type GaN layer which supplies holes.

Figure 1B:
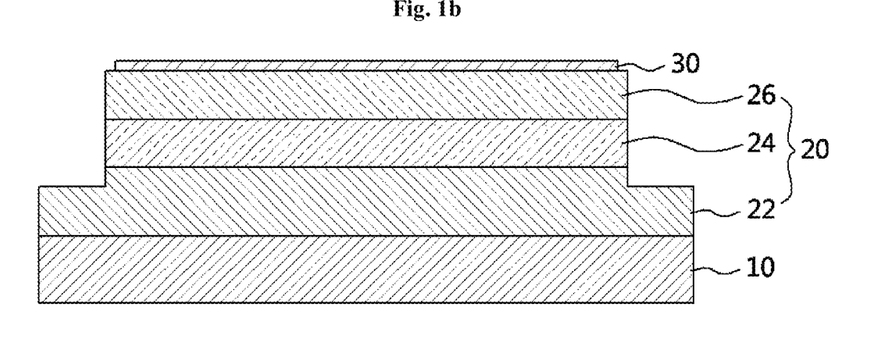

Referring to FIG. 1b, a graphene layer 30 is formed on the second conductive semiconductor layer 26.

Before forming the graphene layer 30, part of the first conductive semiconductor layer 22 to be formed with a first electrode 60 described below may be exposed by etching the compound semiconductor layer 20. However, the present invention is not limited thereto. Alternatively, the part of the first conductive semiconductor layer 22 may be exposed by etching the compound semiconductor layer 20 after forming the graphene layer 30 on the second conductive semiconductor layer 26.

The graphene layer 30 acts as a current spreading layer. The graphene layer 30 may be formed by, for example, chemical vapor deposition (CVD). Chemical vapor deposition may be performed using a mixture of $CH_4$, $H_2$ and Ar at 1000° C. to 1200° C. in an Ar atmosphere. In this case, a graphene film may be grown on a transition metal layer. The graphene film grown on the transition metal layer may be transferred onto the second conductive semiconductor layer 26 to form a graphene layer 30 on the second conductive semiconductor layer 26.

Figure 1C:
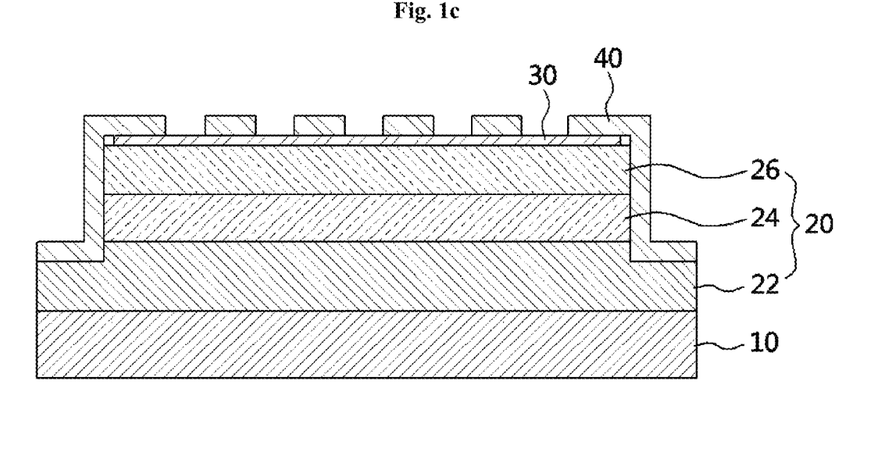

Referring to FIG. 1c, a mask film 40 having a pattern is formed on the graphene layer 30. In some embodiments, the mask film 40 may have hole patterns periodically arranged at a constant pitch. The hole patterns have a hole diameter and a pitch ranging from 1 μm to 10 μm. However, it should be understood that the patterns of the mask film 40 are not limited thereto. For example, the mask film 40 may have any pattern capable of covering about 60% to 80% of the surface area of the graphene layer 30. The mask film 40 may be a typical photoresist (PR) mask.

Figure 1D:
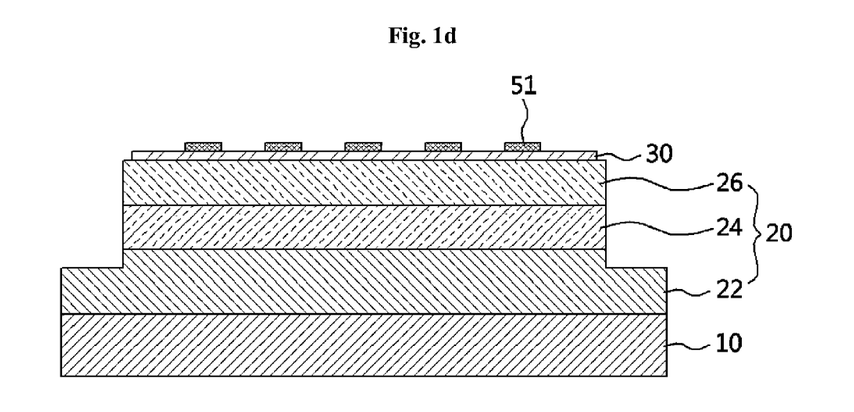

Referring to FIG. 1d, a metal layer 41 is formed within the patterns of the mask film 40. Specifically, the metal layer 51 is formed on upper regions of the graphene layer 30 which is not shielded by the mask film 40. The metal layer 51 may be comprised of at least one selected from among Au, Ag, Pt, Lu, Rh, Pd, Ir, and Os. The metal layer 51 may be formed through electron beam evaporation, thermal evaporation, or sputtering. Then, the mask film 40 is removed, whereby the metal layer 51 is formed in patterns corresponding to the patterns of the mask film 40.

Figure 1E:
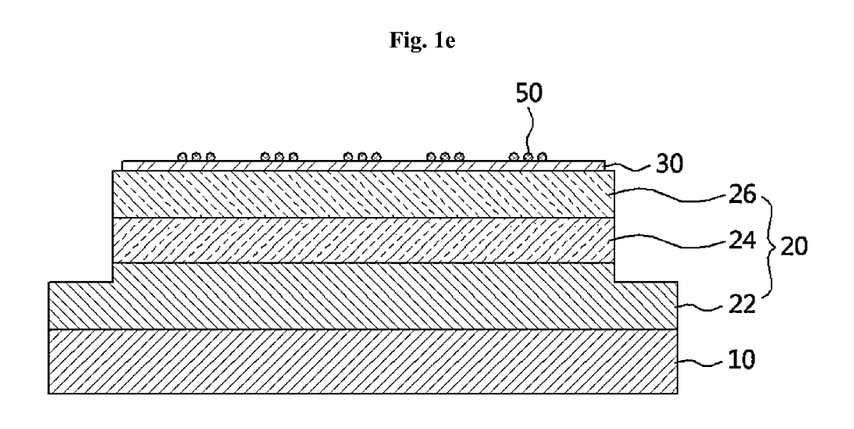

Referring to FIG. 1e, the metal layer 51 is heat treated to form a plurality of metal nanoparticles 50. In some embodiments, heat treatment may be performed at a temperature of 500° C. to 700° C. Heat treatment allows metal elements of the metal layer 51 to combine with each other, thereby forming the metal nanoparticles 50. The metal nanoparticles 50 may be formed to cover from about 20% to about 40% of the surface area of the graphene layer 30.

During heat treatment, the metal elements of the metal layer may diffuse into an interface between the second conductive semiconductor layer 26 and the graphene layer 30. Through diffusion of the metal elements, interfacial adhesion between the second conductive semiconductor layer 26 and the graphene layer 30 may be enhanced. In this case, it is possible to suppress loss of graphene.

Even when comprised of multiple layers, the graphene layer 30 has a thickness ranging from about 2 nm to about 3 nm. Thus, the graphene layer can overlap to form wrinkles or can be torn or damaged in the course of transferring. Thus, as the metal nanoparticles 50 having conductivity are formed on the graphene layer 30, damaged portions of the graphene layer 30 may be electrically connected to each other by the metal nanoparticles 50. Accordingly, it may be ensured to allow more uniform spreading of electric current in the light emitting diode.

Further, the metal nanoparticles 50 on the graphene layer 30 provide surface roughness, causing surface scattering of light. Accordingly, the light emitting diode according to this embodiment may have improved light emission efficiency.

Figure 1F:
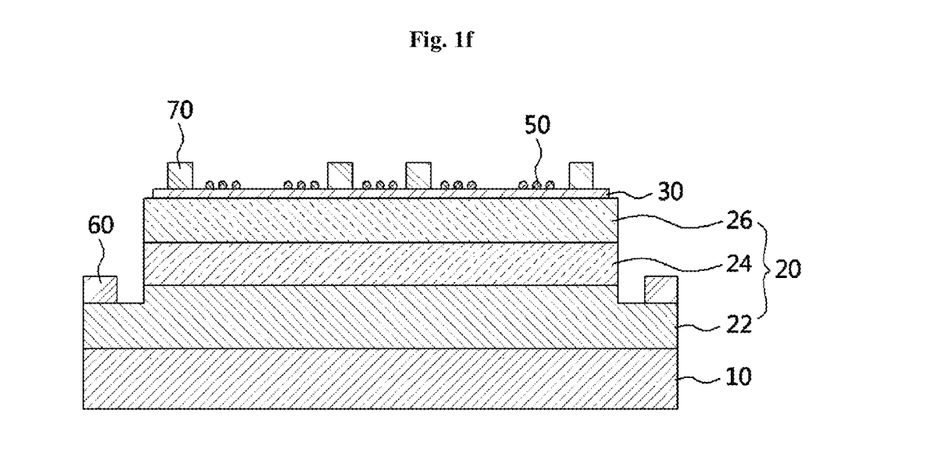

Referring to FIG. 1f, a first electrode 60 is formed on the first conductive semiconductor layer 22 and a second electrode 70 is formed on the graphene layer 30.

In some embodiments, the first and second electrodes 60, 70 may be comprised of at least one selected from among Cr/Au, Ni/Au, Ti/Au, and Ti/Al/Ni/Au, without being limited thereto.

Referring again to FIG. 1f, a light emitting diode according to one embodiment of the present invention will be described.

The substrate 10 placed on the bottom of the light emitting diode may be a homogeneous or heterogeneous substrate with the compound semiconductor layer 20. For example, when the compound semiconductor layer 20 are comprised of GaN-based compound semiconductor layer, a GaN-based substrate may be used as a homogenous substrate. Alternatively, a sapphire substrate, Si substrate, SiC substrate or spinel substrate may be used as a heterogeneous substrate. However, the present invention is not limited thereto, and any substrate enabling growth of the compound semiconductor layer 20 thereon may be used without limitation.

The compound semiconductor layer 20 formed on the substrate 10 may be, for example, GaN-based compound semiconductor layer. In this case, the first conductive semiconductor layer 22 may be, for example, an n-type GaN layer which supplies electrons. The active layer 24 formed on the first conductive semiconductor layer 22 may have a multi-quantum well structure wherein at least one well layer and at least one barrier layer are alternately stacked one above another. For example, the active layer 24 may be comprised of InGaN layers and GaN layers alternately stacked one above another. The second conductive semiconductor layer 26 formed on the active layer 24 may be, for example, a p-type GaN layer which supplies holes.

The graphene layer 30 formed on the second conductive semiconductor layer 26 acts as a current spreading layer. The graphene layer 30 may be formed by growing a graphene film on a transition metal layer through CVD, followed by transferring the graphene film 30 onto the second conductive semiconductor layer 26.

A plurality of metal nanoparticles 50 is formed on the graphene layer 30 to cover some region of the graphene layer 30. In this case, it is possible to suppress reduction in optical transmittance, as compared with the case in which the metal nanoparticles 50 are formed on the overall surface of the graphene layer 30. The plurality of metal nanoparticles 50 may cover from 20% to 40% of the overall surface area of the graphene layer 30. In some embodiments, the plurality of metal nanoparticles 50 disposed on some region of the graphene layer 30 may be formed in hole patterns periodically arranged at a constant pitch. However, the present invention is not limited thereto, and the metal nanoparticles 50 may be disposed in various patterns.

The metal nanoparticles 50 have conductivity. Thus, when the graphene layer overlaps to form wrinkles or is torn or damaged in the course of transferring, the metal nanoparticles 50 may electrically connect damaged portions of the graphene layer 30 to each other. Accordingly, the light emitting diode has improved electrical characteristics by improving ohmic characteristics while reducing parasitic resistance. In addition, the metal nanoparticles 50 may act as flow passages of electric current by electrically connecting the damaged portions of the graphene layer 30, thereby enabling more uniform spreading of electric current.

The metal nanoparticles 50 may exhibit a non-linear, high index of refraction in a specific wavelength band when light is incident thereon. Therefore, as the metal nanoparticles 50 are formed on the graphene layer 30, it is possible to improve light emission efficiency through induction of additional scattering.

The metal nanoparticles 50 may have a particle diameter ranging from 50 nm to 300 nm. As a result, the metal nanoparticles 50 provide roughness to the surface of the light emitting diode and cause diffuse scattering instead of total reflection on the border of the light emitting diode, thereby improving light emission efficiency.

In some embodiments, the metal nanoparticles 50 may be comprised of at least one selected from among Au, Ag, Pt, Lu, Rh, Pd, Ir, and Os.

The first electrode formed on the first conductive semiconductor layer 22 and the second electrode formed on the graphene layer may be comprised of at least one selected from among Cr/Au, Ni/Au, Ti/Au and Ti/Al/Ni/Au, without being limited thereto.

Next, the present invention will be described with reference to examples. However, it should be understood that these examples are provided for illustration only and are not intended to limit the scope of the present invention.

EXAMPLE

On a sapphire substrate, an undopped GaN layer, an n-type GaN layer, an InGaN/GaN multi-quantum well active layer, and a p-type GaN layer were sequentially stacked, followed by mesa-etching to expose some region of the n-type GaN layer. Then, a graphene film grown through CVD was transferred onto the p-type GaN layer to form a graphene layer. Next, a photoresist mask having hole patterns was disposed on the graphene layer and an Ag layer was deposited within the holes. Here, the holes had a diameter of 2 μm and periodically arranged at a constant pitch of 4 μm. Then, the mask film was removed, and the Ag layer was heat treated at 600° C. to form Ag nanoparticles. Then, Cr/Au electrodes were formed on the n-type GaN layer and the graphene layer, respectively, thereby fabricating a light emitting diode.

Comparative Example 1

On a sapphire substrate, an undopped GaN layer, an n-type GaN layer, an InGaN/GaN multi-quantum well active layer, and a p-type GaN layer were sequentially stacked, followed by mesa-etching to expose some region of the n-type GaN layer. Then, a graphene film grown through CVD was transferred onto the p-type GaN layer to form a graphene layer. Next, Cr/Au electrodes were formed on the n-type GaN layer and the graphene layer, respectively, thereby fabricating a light emitting diode. In Comparative Example 1, the light emitting diode includes only the graphene layer on the p-type GaN layer.

Comparative Example 2

On a sapphire substrate, an undoped GaN layer, an n-type GaN layer, an InGaN/GaN multi-quantum well active layer, and a p-type GaN layer were sequentially stacked, followed by mesa-etching to expose some region of the n-type GaN layer. Then, a graphene film grown through CVD was transferred onto the p-type GaN layer to form a graphene layer. Next, an Ag layer was deposited over the surface of the graphene layer and was heat treated at 600° C. to form Ag nanoparticles. Then, Cr/Au electrodes were formed on the n-type GaN layer and the graphene layer, respectively, thereby fabricating a light emitting diode. In Comparative Example 2, the light emitting diode includes the Ag nanoparticles formed on the overall surface of the graphene layer.

Figure 2A:
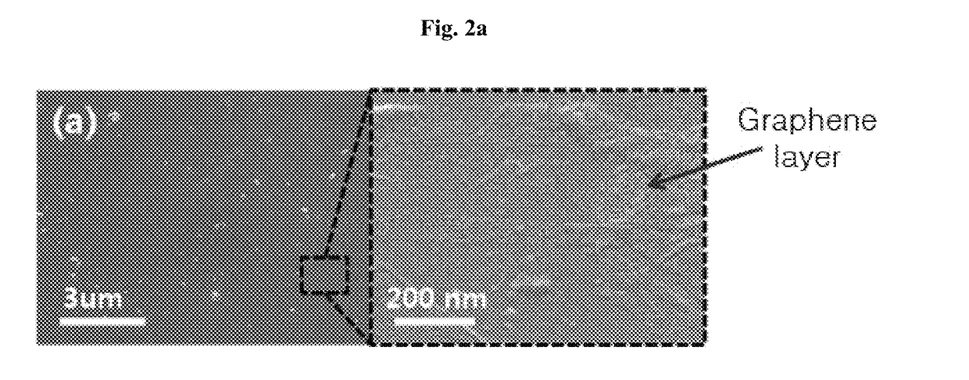
FIG. 2a to FIG. 2c are SEM images of surfaces of graphene layers of light emitting diodes of Example and Comparative Examples.
Figure 2B:
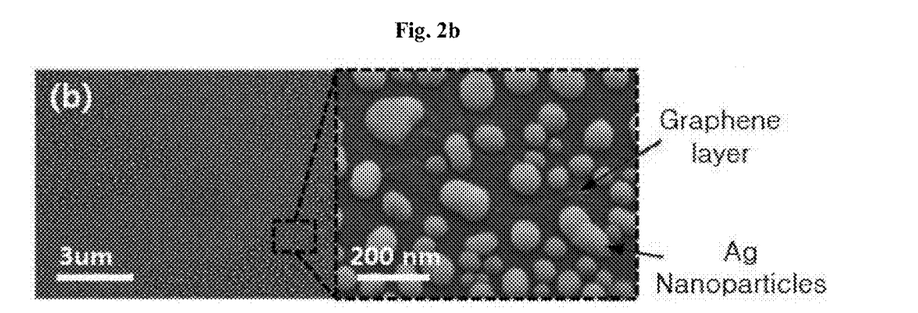
Figure 2C:
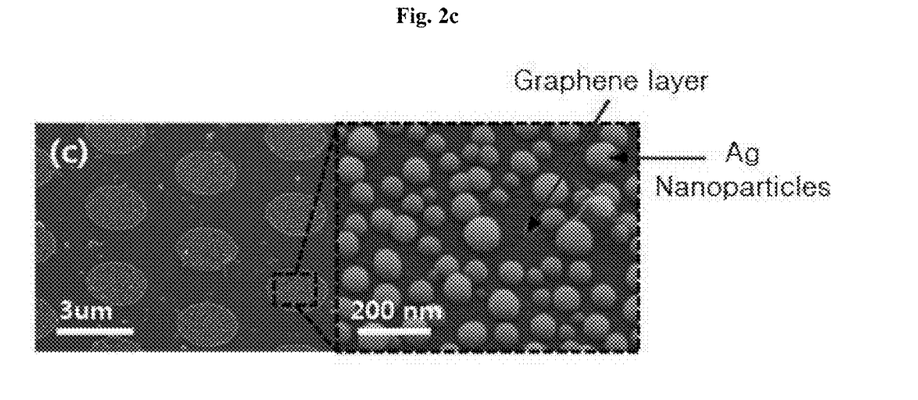

FIG. 2a to FIG. 2c show SEM images of surfaces of graphene layers of the light emitting diodes of the example and the comparative examples.

Referring to FIG. 2a, in Comparative Example 1, it could be seen that wrinkles were formed on the surface of the graphene layer. Namely, it could be seen that the graphene layer was not evenly formed. The wrinkles can be formed during formation of the graphene layer on the second conductive semiconductor layer. The wrinkles can be created when the graphene layer partially overlaps. Since the graphene layer has a very low thickness, the graphene layer can partially overlap or can be partially torn in the course of being transferred onto the second conductive semiconductor layer. As a result, the graphene layer can be damaged. The damage of the graphene layer may cause non-uniform spreading of electric current.

Referring to FIGS. 2b and 2c, it could be seen that in Comparative Example 2 and Example, the Ag nanoparticles were stably formed on the graphene layer. In Comparative Example 2, a plurality of Ag nanoparticles having a particle diameter of about 50 nm to about 200 nm was formed on the overall surface of the graphene layer. On the other hand, in Example, a plurality of Ag nanoparticles having a particle diameter of about 50 nm to about 200 nm was formed within the hole patterns of the graphene layer, in which the hole patterns were periodically arranged at a constant pitch. Here, the hole patterns had a hole diameter of about 2 μm and were arranged at a constant pitch of about 4 μm. The plurality of Ag nanoparticles can be formed to cover damaged portions of the graphene layer such as wrinkles. Accordingly, the plurality of Ag nanoparticles may connect the damaged portions of the graphene layer to each other, thereby enabling more uniform spreading of electric current.

Figure 3A:
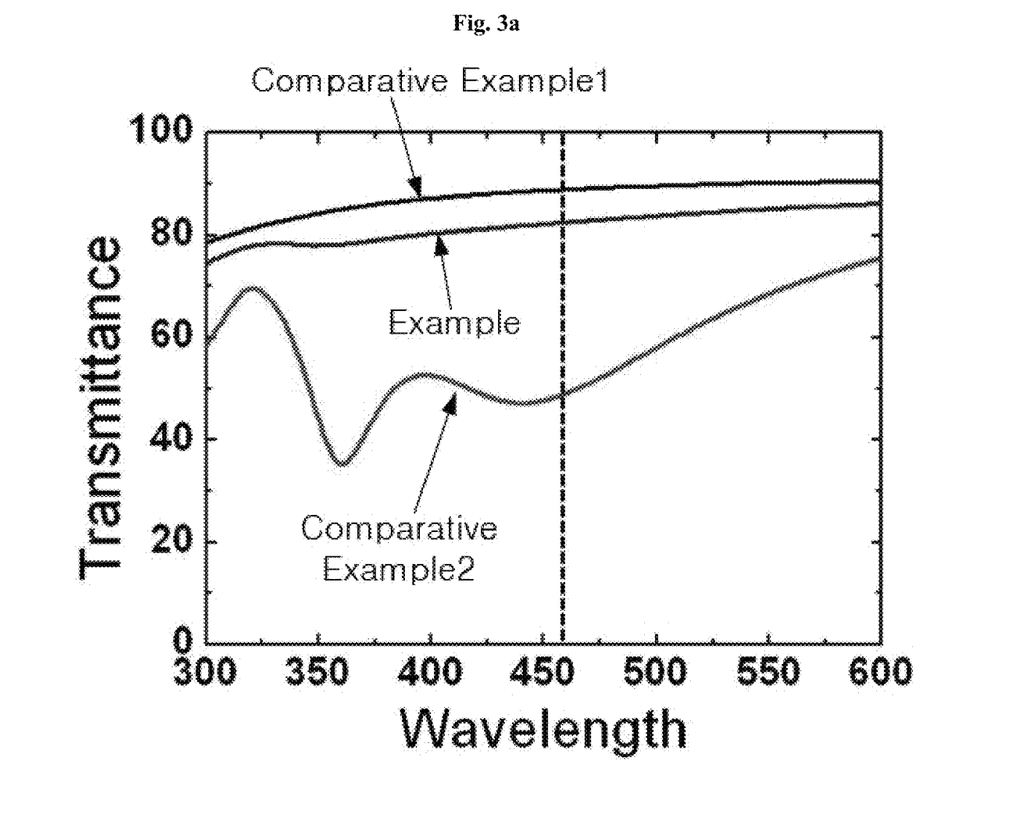
FIG. 3a and FIG. 3b are graphs depicting light transmittance and relative intensity according to wavelength of light emitted from the light emitting diodes prepared in Example and Comparative Examples.
Figure 3B:
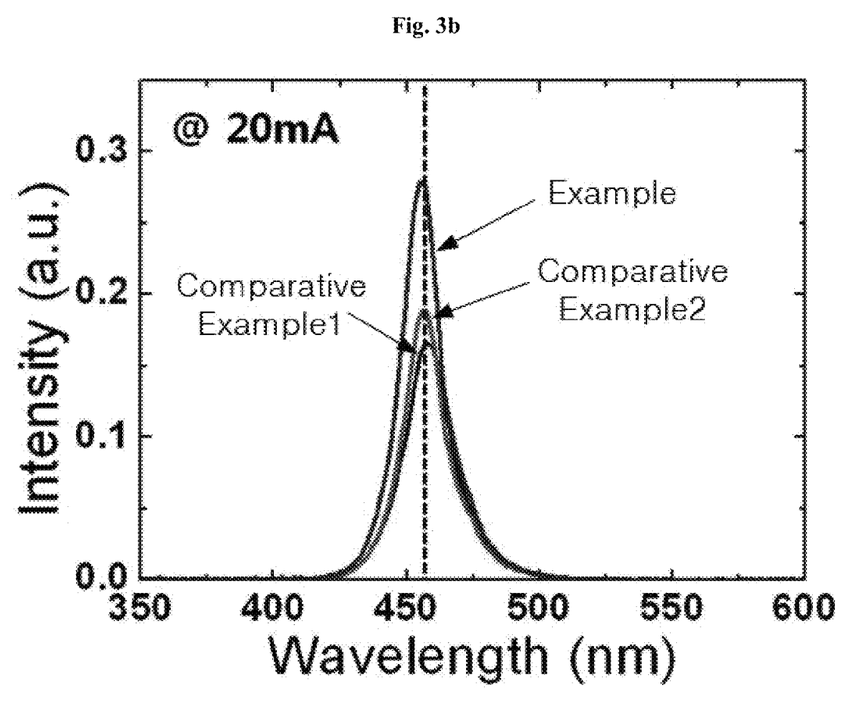

FIG. 3a and FIG. 3b are graphs depicting light transmittance and relative intensity according to wavelength of light emitted from the light emitting diode prepared in Example and Comparative Examples.

Referring to FIG. 3a, it could be seen that the light emitting diode of Comparative Example 2 had significantly deteriorate optical transmittance as compared with those of Comparative Example 1 and Example. It was believed that this result was caused by the plurality of Ag nanoparticles formed on the overall surface of the graphene layer. In particular, it could be seen that optical transmittance was significantly deteriorated in a particular wavelength band due to localized surface plasmon resonances (LSPs) resulting from interaction between the Ag nanoparticles and incident light.

Referring to FIG. 3b, it could be seen that, in a blue light wavelength of about 460 nm, the light emitting diode of Example exhibited a significantly high luminescence peak as compared with Comparative Examples 1 and 2. In addition, since the light emitting diode of Comparative Example 2 exhibited a higher luminescent peak than Comparative Example 1, it could be seen that the light emitting diodes including the plurality of Ag nanoparticles on the graphene layer (Comparative Example 2 and Example) were deteriorated in optical transmittance but had improved luminescent characteristics, as compared with the light emitting diode having no Ag nanoparticles on the graphene layer (Comparative Example 1). It was believed that this result was obtained by formation of the Ag nanoparticles on the graphene layer allowing more uniform current spreading.

Figure 4:
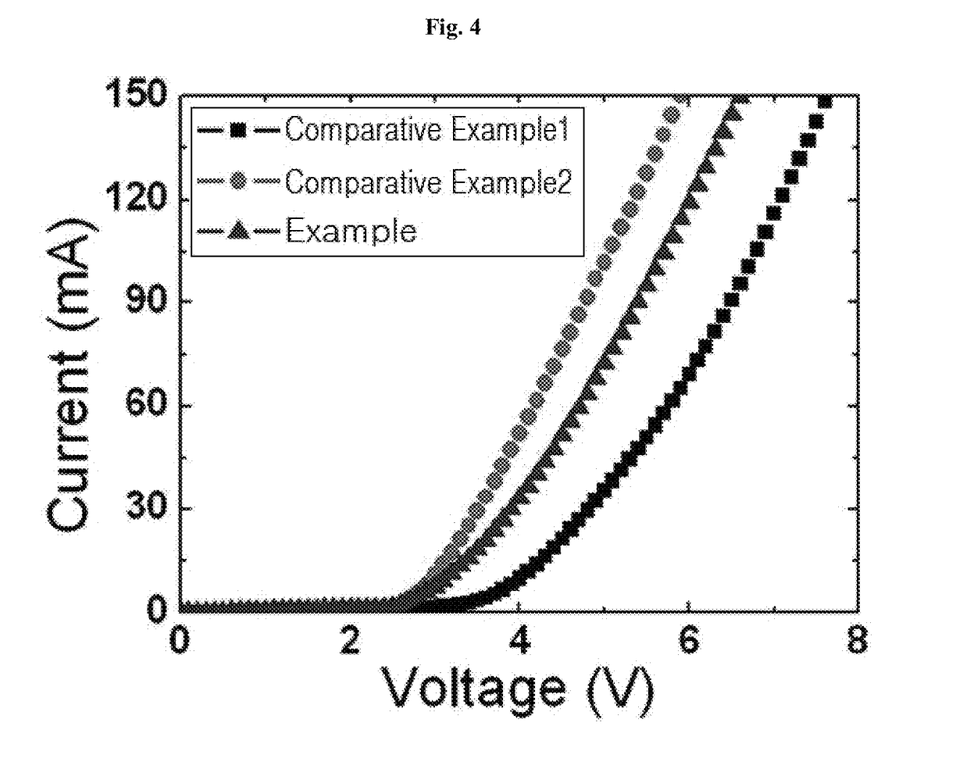
FIG. 4 is a current-voltage (I-V) curve of the light emitting diodes prepared in Example and Comparative Examples.

FIG. 4 is a current-voltage (I-V) curve of the light emitting diodes prepared in Example and Comparative Examples.

Referring to FIG. 4, it could be seen that in Comparative Example 2 and Example, each of the light emitting diodes had a turn-on voltage of about 3.3 V, and the light emitting diode of Comparative Example 1 had a turn-on voltage of about 4.3 V. For example, for an electric current of 60 mA, the light emitting diode of Example required a voltage of about 4.9 V, which was significantly lower than a voltage of about 6 V for the light emitting diode of Comparative Example.

Accordingly, it could be seen that, when the Ag nanoparticles were formed on the graphene layer, the light emitting diode had improved electric characteristics through improvement of ohmic characteristics and reduction of parasitic resistance. It was believed that this result was obtained by formation of the Ag nanoparticles, which were formed on the graphene layer to allow smooth flow of electric current at overlapping or damaged portions of the graphene layer such that the electric current can be efficiently spread.

Figure 5:
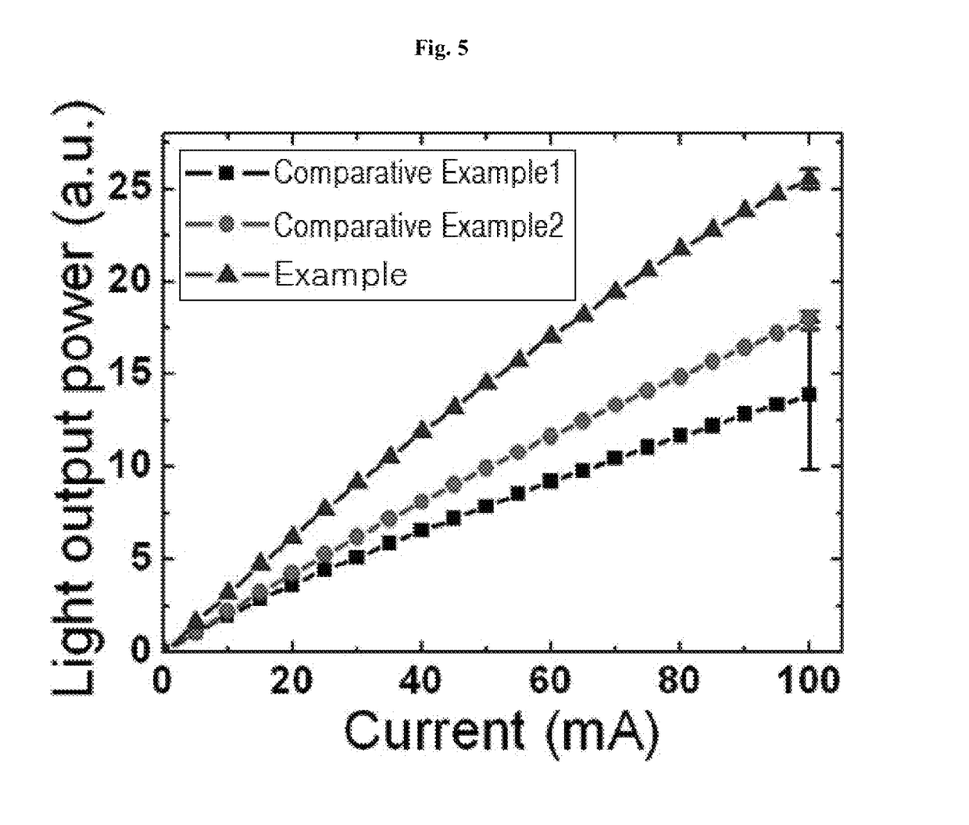
FIG. 5 is a light output-current (L-I) curve of the light emitting diodes prepared in Example and Comparative Examples.

FIG. 5 is a light output-current (L-I) curve of the light emitting diodes prepared in Example and Comparative Examples.

Referring to FIG. 5, it could be seen that light output was high in the sequence of Example, Comparative Example 2 and Comparative Example 1 (Example>Comparative Example 2>Comparative Example 1) for the same electric current. In particular, it could be seen that the light emitting diode of Example had light output of about 1.7 times that of Comparative Example 1 in which the Ag nanoparticles were not formed.

Figure 6A:
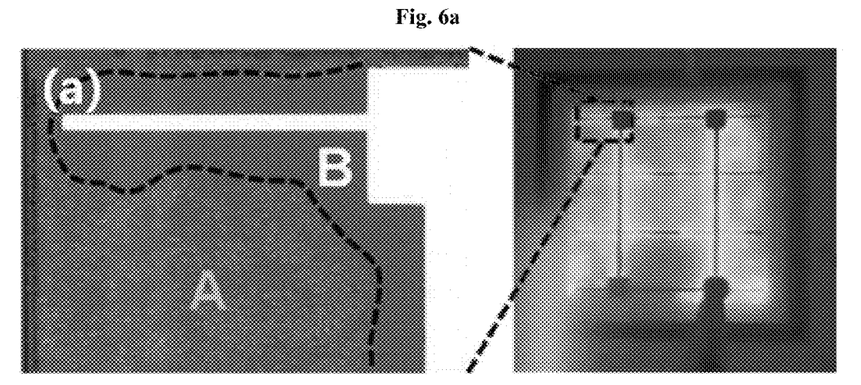
FIG. 6a to FIG. 6c are pictures of the light emitting diodes of Example and Comparative Examples, which emit light from the surface thereof upon application of electric current thereto.
Figure 6B:
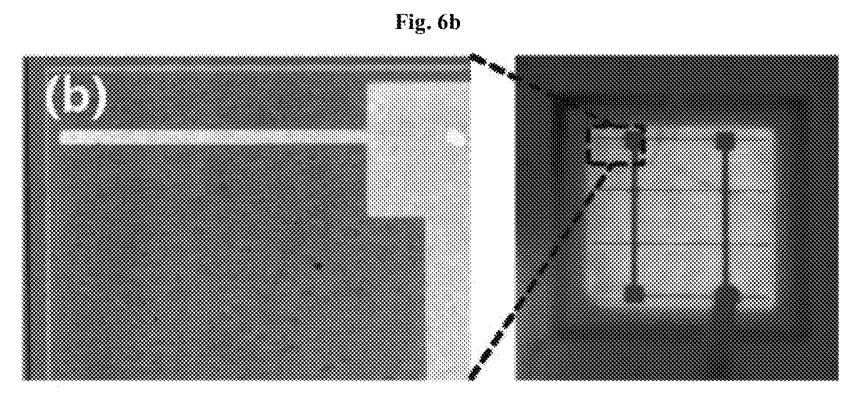
Figure 6C:
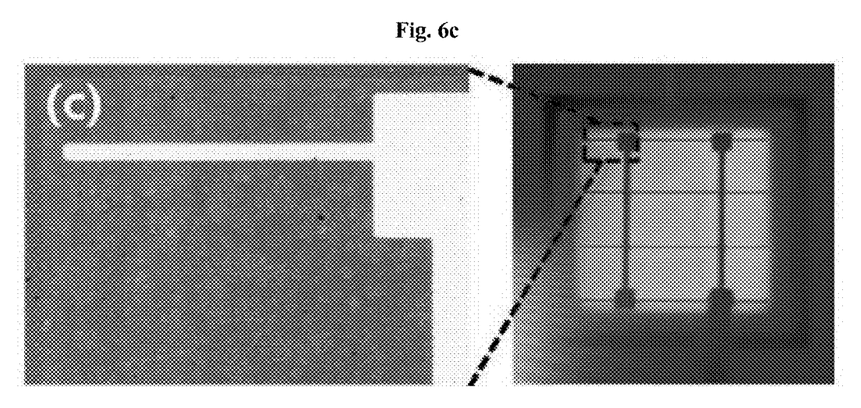

FIG. 6a to FIG. 6c are pictures of the light emitting diodes of Example and Comparative Examples, which emit light from the surface thereof upon application of electric current thereto. FIG. 6a shows the light emitting diode of Comparative Example 1, FIG. 6b shows the light emitting diode of Comparative Example 2, and FIG. 6c shows the light emitting diode of Example.

Referring to FIG. 6a, it could be seen that the graphene was observed in Region A, whereas the graphene was not observed in Region B adjacent to the second conductive semiconductor layer. In this case, electric current was not efficiently spread and concentrated on Region B adjacent to the second conductive semiconductor layer. As a result, since surface luminescence strongly occurred only in Region B, the light emitting diode exhibited non-uniform surface light emitting characteristics.

In FIGS. 6b and 6c, the graphene can be observed around the second conductive semiconductor layer. In other words, the graphene can be observed on the overall surface of the graphene layer. It was believed that this result could be obtained due to diffusion of Ag atoms into the interface between the second conductive semiconductor layer and the graphene layer in the course of heat treatment for forming the Ag nanoparticles, which resulted in enhanced adhesion between the second conductive semiconductor layer and the graphene layer while suppressing loss of the graphene. Thus, it could be seen that electric current was relatively efficiently spread, thereby enabling uniform surface light emission. In addition, the Ag nanoparticles formed on the overlapping or damaged portions of the graphene layer served as flow passages of electric current, thereby enabling efficient spreading of electric current. Here, it could be seen that the light emitting diode of FIG. 6c exhibited superior surface light emission characteristics to the other light emitting diodes. It was believed that this result was obtained due to formation of the plurality of Ag nanoparticles on some region of the graphene layer in the light emitting diode of Example, which prevented significant reduction of optical transmittance.

Although some exemplary embodiments have been described herein, it should be understood by those skilled in the art that these embodiments are given by way of illustration only, and that various modifications, variations and alterations can be made without departing from the spirit and scope of the invention. Therefore, the embodiments and the accompanying drawings should not be construed as limiting the technical spirit of the present invention, but should be construed as illustrating the technical spirit of the present invention. The scope of the invention should be interpreted according to the following appended claims as covering all modifications or variations derived from the appended claims and equivalents thereof.

What is claimed is:

1. A light emitting diode comprising:
    a compound semiconductor layer including a first conductive semiconductor layer, an active layer and a second conductive semiconductor layer;
    a graphene layer formed on the second conductive semiconductor layer;
    a plurality of metal nanoparticles formed on the graphene layer;
    a first electrode formed on the first conductive semiconductor layer; and
    a second electrode formed on the graphene layer,
    wherein the metal nanoparticles are formed on some region of the graphene layer.

2. The light emitting diode according to claim 1, wherein the metal nanoparticles formed on the graphene layer occupy from 20% to 40% of a surface area of the graphene layer.

3. The light emitting diode according to claim 1, wherein the some region of the graphene layer is formed with hole patterns periodically arranged at a constant pitch.

4. The light emitting diode according to claim 1, wherein the metal nanoparticles comprise at least one selected from among Au, Ag, Pt, Lu, Rh, Pd, Ir and Os.

5. The light emitting diode according to claim 1, wherein the metal nanoparticles have a particle diameter of 50 nm to 300 nm.

6. The light emitting diode according to claim 1, wherein the compound semiconductor layer is nitride-based compound semiconductor layer.

* * * * *